(12) United States Patent
Lovett et al.

(10) Patent No.: US 6,690,606 B2
(45) Date of Patent: Feb. 10, 2004

(54) ASYNCHRONOUS INTERFACE CIRCUIT AND METHOD FOR A PSEUDO-STATIC MEMORY DEVICE

(75) Inventors: Simon J. Lovett, Boise, ID (US); Cliff Zitlaw, San Jose, CA (US); Brian M. Shirley, Boise, ID (US); Roger D. Norwood, McKinney, TX (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/102,221

(22) Filed: Mar. 19, 2002

(65) Prior Publication Data

US 2003/0179612 A1 Sep. 25, 2003

(51) Int. Cl.$^7$ .................................................. G11C 7/00
(52) U.S. Cl. ..................... 365/194; 365/233.5; 365/233; 365/230.08; 365/222
(58) Field of Search ............................ 365/194, 233.5, 365/233, 230.08, 222

(56) References Cited

U.S. PATENT DOCUMENTS

| | | | |
|---|---|---|---|
| 5,258,952 A | * 11/1993 | Coker et al. ................ 365/194 |
| 5,471,157 A | * 11/1995 | McClure ...................... 326/93 |
| 5,566,129 A | * 10/1996 | Nakashima et al. ...... 365/233.5 |
| 5,805,517 A | *  9/1998 | Pon .............................. 365/212 |
| 5,835,440 A | * 11/1998 | Manning ................. 365/230.06 |
| 6,058,070 A | *  5/2000 | La Rosa .................... 365/233.5 |
| 6,075,751 A | *  6/2000 | Tedrow .................... 365/233.5 |
| 6,396,758 B2 | *  5/2002 | Ikeda et al. ................. 365/222 |

OTHER PUBLICATIONS

"Intel ® 1.8 Volt Wireless Flash Memory (W18/W30)," Product Brief Flash Products Group, Intel Corporation, 2002, pp. 1–2.
"1.8 Volt ® Wireless Flash Memory (W18)," Datasheet, Intel Corporation, Jan. 2003, pp. 1–102.

* cited by examiner

Primary Examiner—Michael S. Lebentritt
Assistant Examiner—Toan Le
(74) Attorney, Agent, or Firm—Dorsey & Whitney LLP

(57) ABSTRACT

An asynchronous address interface circuit and method for converting unrestricted randomly scheduled address transitions of memory address signals into scheduled address events from which initiation of a sequence of memory access events can be based. The address interface circuit initiates a delay sequence based on a address transition detection pulse. In the event a new address transition detection pulse is received prior to completion of the delay sequence, the delay sequence is reset and restarted based on the new address transition detection pulse. The sequence of memory access events is initiated in response to the completion of the delay sequence.

42 Claims, 5 Drawing Sheets

ASYNCHRONOUS INTERFACE CIRCUIT AND METHOD FOR A PSEUDO-STATIC MEMORY DEVICE

TECHNICAL FIELD

The present invention is related generally to the field of semiconductor memory devices, and more particularly, to an interface circuit and method for a pseudo-static memory device.

BACKGROUND OF THE INVENTION

A class of memory devices called pseudo-static memory are typically memory devices that are functionally equivalent to static random access memory (SRAM) devices, but include internal refresh circuitry, so that the devices appear to the use as not needing refresh operations. In general, these memory devices can be operated in the same manner one would operate a conventional SRAM, but have a memory core based on conventional dynamic random access memory (DRAM) cells. As is well known in the art, a major distinction between the two types of memory cells is that DRAM memory cells need to be periodically refreshed to maintain the stored data whereas SRAM memory cells do not.

There are advantages to employing a conventional DRAM memory core over a conventional SRAM memory core in a memory device. For example, memory density for a DRAM memory array can be much greater than that for a SRAM memory array. In the case of a DRAM memory cell, only one transfer gate and a storage device, typically a capacitor, is necessary to store one bit of data. Consequently, each DRAM memory cell is considerably smaller than a conventional SRAM memory cell, which may have as many as six transistors per memory cell. The simple structure and smaller size of the DRAM memory cell translates into a less complicated manufacturing process, and consequently, lower fabrication costs when compared to the SRAM memory cell.

In spite of the aforementioned advantages provided by a DRAM memory core, there are issues related to the design and operation of a conventional DRAM memory array that make its application undesirable. For example, as previously mentioned, DRAM memory cells need to be refreshed periodically or the data stored by the capacitors will be lost. As a result, additional circuitry must be included in the memory device to support the refresh operation. It is also generally the case that access times for DRAM memory cores are greater than the access times for SRAM memory cores.

Additionally, a memory access operation for a conventional DRAM memory core is such that once the operation has begun, the entire access cycle should be completed or the data will be lost. That is, a DRAM access cycle begins with a row of memory cells in the array being activated, and the respective charge state of the memory cells for the activated row are sensed and amplified. A column including a particular memory cell of the activated row is selected by coupling the column to an input/output line. At this time, data can be read from or written to the particular memory cell. Following the read or write operation, the row of memory cells is deactivated, thus, storing the charge state in the respective capacitors of the memory cells. As is generally known, the process of sensing the charge state of the memory cells is destructive, and unless the access cycle is completed with the charge state being amplified and the row being deactivated, the data stored by the memory cells of the activated row will be lost. In contrast, for a conventional asynchronous SRAM memory device, the SRAM sense operation is non-destructive and does not have the same type of access cycle as a conventional DRAM memory device. Consequently, random memory addresses may be asserted to the SRAM memory device without timing restriction, and data is always expected to be returned in a certain time thereafter. This time is typically referred to as the address access time $t_{AA}$.

Therefore, it is desirable to have a circuit that can accommodate the asynchronous nature of an SRAM memory device and transform these actions to the scheduled events of a conventional DRAM memory access operation in order to provide an asynchronous pseudo-static memory device that employs a conventional DRAM memory core.

SUMMARY OF THE INVENTION

The present invention is directed to an apparatus and method for converting unrestricted randomly scheduled address transitions of memory address signals into scheduled address events from which initiation of a sequence of memory access events can be based. An address interface circuit includes an address detection circuit that receives a memory address and generates a detection pulse in response to each receipt of a new memory address. Further included in the address interface circuit is a pulse circuit coupled to the address detection circuit. The pulse circuit generates an initiation pulse that initiates a memory access operation after a time delay elapses from receiving the detection pulse from the address detection circuit. However, where another detection pulse is received by the pulse circuit prior to the time delay elapsing, the time delay is reset by the new detection pulse, and the pulse circuit will then generate the initiation pulse following the time delay elapsing from receipt of the new detection pulse. The initiation pulse generated by the pulse circuit can then be used to start a sequence of access events to access a memory array.

DETAILED DESCRIPTION OF THE INVENTION

Embodiments of the present invention are directed to an asynchronous interface circuit that converts randomly scheduled address transitions, such as those applied to an SRAM device, into scheduled address events which can be asserted to a conventional DRAM memory core in an orderly fashion. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
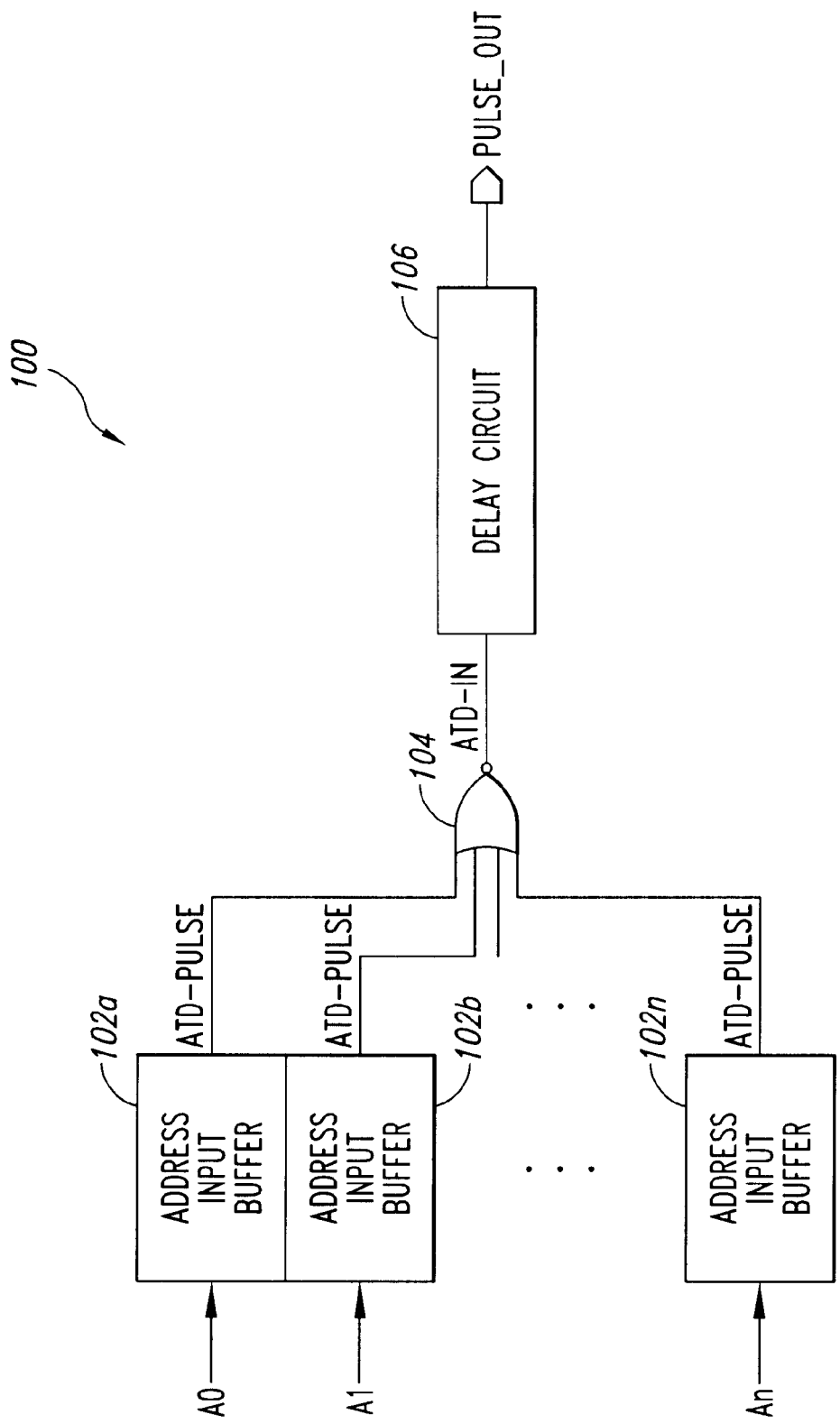
FIG. 1 is a functional block diagram of an asynchronous interface circuit according to an embodiment of the present invention.

Illustrated in FIG. 1 is an asynchronous interface circuit 100 according to an embodiment of the present invention. The asynchronous interface circuit 100 includes address input buffers 102a–n, each receiving a respective input address signal representing one bit of the input address A0–An, and further having outputs coupled to inputs of a NOR gate 104. Each of the row address input buffers 102a–n includes an address transient detector (ATD) that generates an output pulse ATD_PULSE in response to the respective input address signal making a logic state transition. The row address input buffers 102a–n, and the ATDs included in each are conventional in design and are known in the art. With the configuration shown in FIG. 1, when an ATD_PULSE is output by any of the row address input buffers 102a–102n, the NOR gate 104 generates an output pulse ATD_IN that is provided to a delay circuit 106. The delay circuit 106 generates an output PULSE_OUT that is used to begin an access operation of the DRAM memory core.

The asynchronous interface circuit 100 can be used with a conventional DRAM memory core to provide an asynchronous pseudo-static SRAM operation. As previously mentioned, a conventional DRAM memory core is not well suited for the asynchronous nature of a conventional SRAM address interface because random addresses can be asserted without timing restriction. In the case of a read operation, a time period after the address is asserted, typically referred to as the address access time, $t_{AA}$, output data is provided. In the event the timing specifications are violated, and the address changes before the output data is provided, data stored by the SRAM memory core will not be lost because of the manner in which data is stored by conventional SRAM memory cells. In contrast, in a conventional DRAM memory core, once memory access of a memory location has begun, the access operation must be completed or run the risk of losing data since DRAM has intrinsically a destructive read sequence. As will be explained in more detail below, the asynchronous interface circuit 100, however, can take randomly scheduled address transitions, such as those allowed for conventional SRAM devices, and convert them into scheduled events which can be asserted to a DRAM memory core in an orderly fashion.

Figure 2:
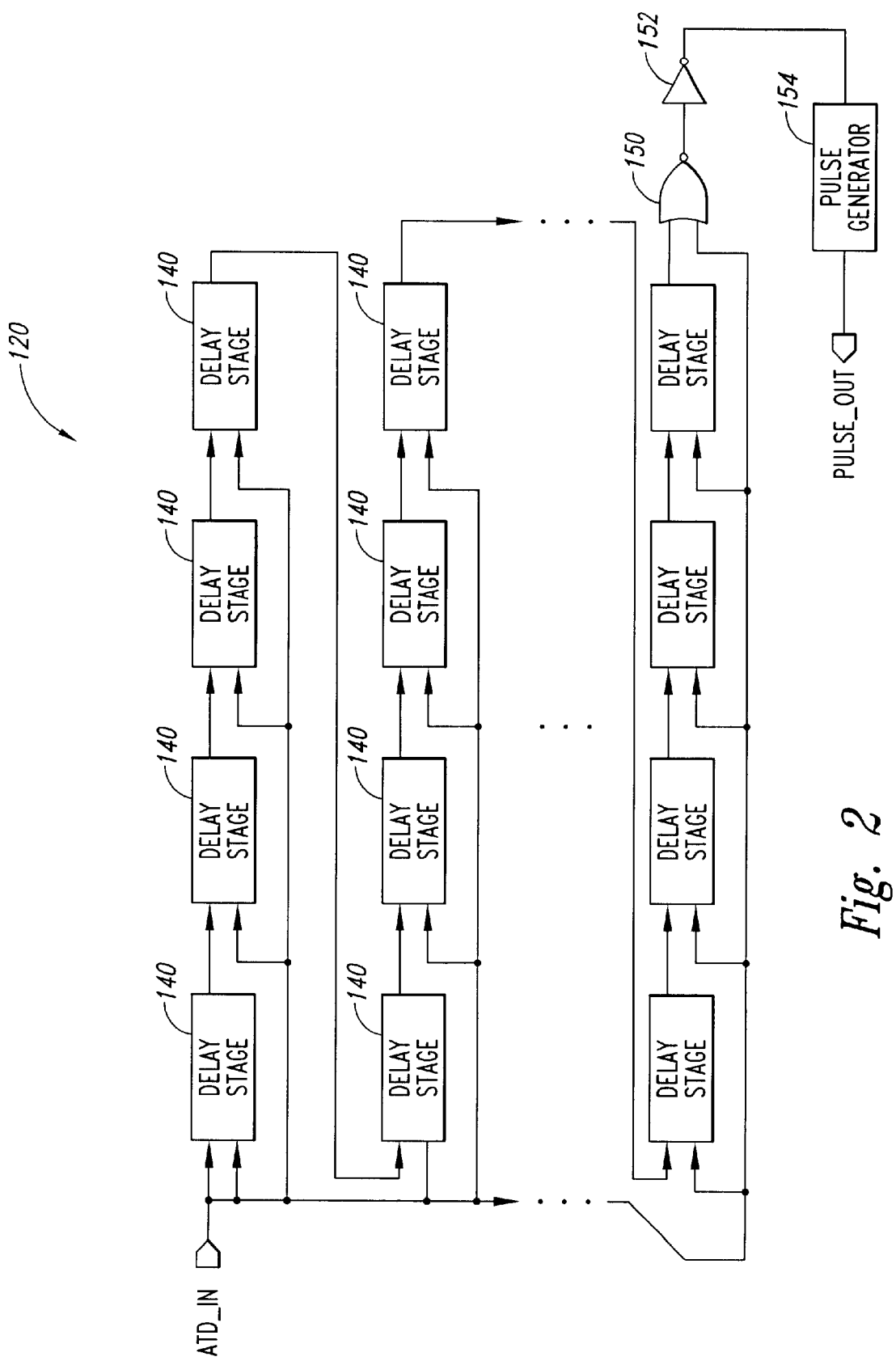
FIG. 2 is a functional block diagram of a delay circuit according to an embodiment of the present invention.
Figure 3:
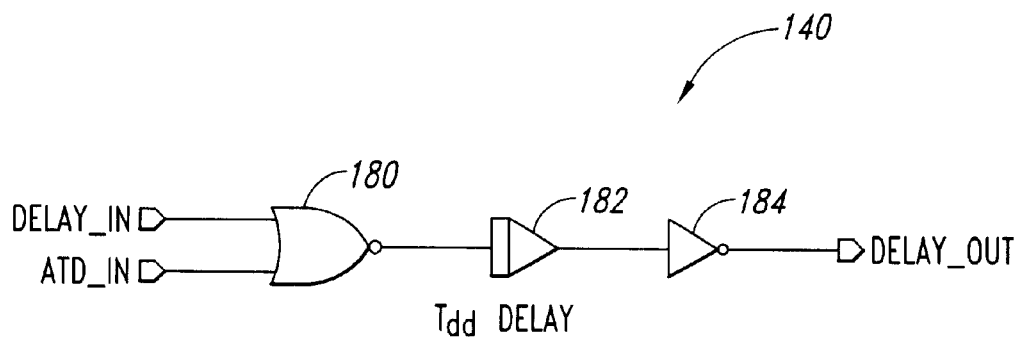
FIG. 3 is a schematic drawing of a delay stage according to an embodiment of the present invention.

FIG. 2 illustrates a delay circuit 120 according to an embodiment of the present invention. The delay circuit 120 can be substituted for the delay circuit 106 shown in FIG. 1. The delay circuit 120 includes at least one delay stage 140. Each delay stage 140 has a delay input and an ATD input, and further has a delay output. An embodiment of the delay stage 140 is illustrated in FIG. 3. The delay stage 140 includes a two-input NOR gate 180 having an output coupled to an input of an inverter 184 through a delay device 182. A first input of the NOR gate 180 represents the delay input and a second input represents the ATD input. In operation, the delay stage 140 provides an output signal that is similar to the signal applied to the delay input except that it is delayed by a time $t_{dd}$ of the delay device 182.

With reference to FIG. 2, where the delay circuit 120 includes a plurality of delay stages 140, a first delay stage 140 receives the ATD_IN signal at both its delay input and reset input. Subsequent delay stages 140 are coupled such that the delay input is coupled to the delay output of the previous delay stage 140, as illustrated in FIG. 2. Each delay stage 140 generates at its delay output a version of the signal applied to its delay input but delayed by a time delay $t_{dd}$. The ATD input of each of the delay stages 140 is coupled to receive the ATD_IN signal. The delay output of the last delay stage 140 is coupled to a first input of a two-input NOR gate 150. A second input of the NOR gate 150 is coupled to receive the ATD_IN signal. An output of the NOR gate 150 is coupled to a pulse generator 154 through an inverter 152. The pulse generator 154 generates a pulse PULSE_OUT in response to the falling edge of signal output by the inverter 152. The PULSE_OUT signal, as previously mentioned, is used to start an access operation to a conventional DRAM memory core.

In operation, the delay circuit 120 generates a PULSE_OUT pulse a time delay $t_d$ after the falling edge of the most recent ATD_IN pulse. The time delay $t_d$ is approximately the sum of the delay of each delay stage 140. In an effort to simplify explanation of the delay circuit 120, any gate delays have been ignored. However, it will be appreciated that some time will be added to the time delay $t_d$ because of the gate delays. When the delay circuit 120 receives an ATD_IN pulse, the output of the inverter 152 goes HIGH and the delay output of each of the delay stages 140 go HIGH $t_{dd}$ after the rising edge of the ATD_IN pulse. On the falling edge of the ATD_IN pulse, the delay circuit begins counting the time delay $t_d$. That is, for the first delay stage 140 in the chain, its delay output will go LOW $t_{dd}$ after the falling edge of the ATD_IN pulse. The delay output of the second delay stage 140 will go LOW $t_{dd}$ after the falling edge of the delay output of the first delay stage 140. Thus, the falling edge of the ATD_IN pulse will trickle through the chain of delay stages 140 until being applied to the input of the NOR gate 150. Note that during this time, the output of the inverter 152 has remained HIGH. Not until the delay output of the last delay stage 140 goes LOW, which occurs $t_d$ after the falling edge of the ATD_IN signal, will the output of the inverter 152 go LOW. When this does occur, the pulse generator 154 then generates a PULSE_OUT pulse that can be used to start an access operation to a DRAM memory core.

In the case where a second ATD_IN pulse is received by the delay circuit 120 before the $t_d$ timing count has elapsed, the delay stages 140 of the timing chain are essentially reset because the delay output of each of the delay stages 140 will go HIGH again in response to the new ATD_IN pulse. The $t_d$ countdown will begin again in response to the falling edge of the new ATD_IN pulse, as previously described. In effect, the pulse generator 154 will not generate a PULSE_OUT pulse until $t_d$ after the falling edge of the last ATD_IN pulse provided to the delay circuit 120, and consequently, no access operation will be initiated until that time.

Thus, it can be seen that an unrestricted address transition input pattern can be converted by the asynchronous interface circuit 100 (FIG. 1) into scheduled address events suitable for scheduled array accesses of a DRAM memory core. That is, with the asynchronous interface circuit 100, once a given address is asserted to the DRAM memory core, no new addresses are asserted until the access in progress has completed.

Figure 4:
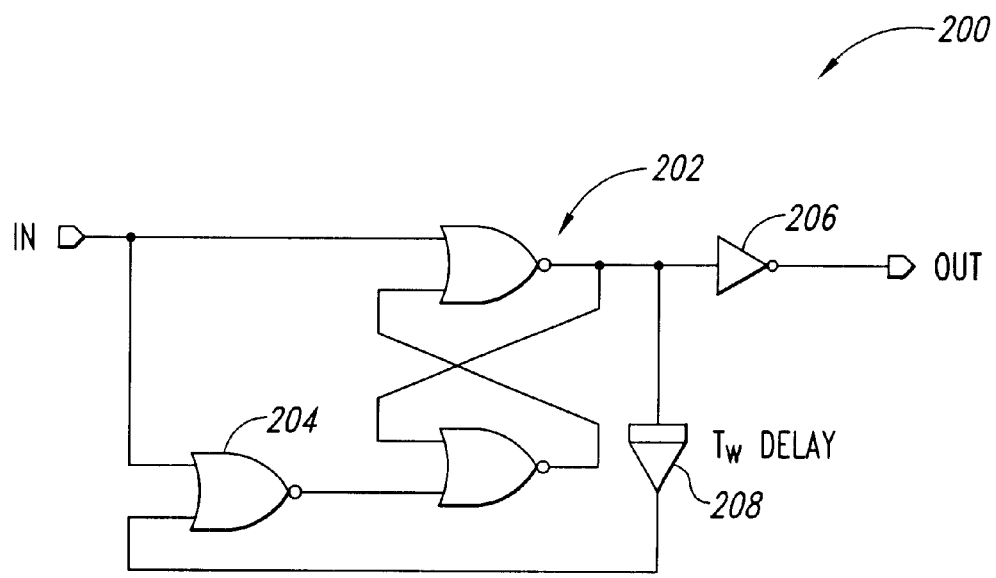
FIG. 4 is a schematic drawing of a pulse circuit according to an embodiment of the present invention.

FIG. 4 illustrates a pulse circuit 200 according to an embodiment of the present invention. The pulse circuit can be used to generate an output pulse signal OUT having a minimum pulse width of $t_w$, even if the input pulse signal IN has a pulse width less than tw. The pulse circuit 200 can be used to ensure that the ATD_IN signal provided to the delay circuit 120 (FIG. 2) is of sufficient width to reset the delay stages 140 and prevent the pulse generator 154 from generating a PULSE_OUT signal that will inadvertently initiate an access operation of a DRAM memory core. In one embodiment of the present invention, the pulse circuit 200 is coupled between the output of the NOR gate 104 (FIG. 1)

and the input of the delay circuit 106. Thus, even if the output pulse of the NOR gate 104 has a pulse width less than $t_w$, the output pulse of the pulse circuit 200 will provide to the delay circuit 106 a ATD_IN signal of sufficient pulse width to reset the delay circuit 106. It will be appreciated by those of ordinary skill in the art that the polarity of the signals can be reversed in an alternative implementation of the pulse circuit 200 and remain in the scope of the present invention.

The pulse circuit 200 includes an active HIGH S-R latch 202 formed from two cross-coupled NOR gates. The latch 202 has a first input coupled to receive the IN signal and a second input coupled to the output of a two-input NOR gate 204. The output of the latch 202 is coupled to an inverter 206, from which the OUT signal is provided. The output of the latch 202 is also coupled to a first input of the NOR gate 204 through a delay device 208 having a time delay of tw. A second input off the NOR gate 204 is coupled to receive the IN signal. As a result, the pulse circuit 200 will generate an OUT signal having a pulse width of at least $t_w$ from a pulse IN signal, even if the pulse width of the IN signal is less than tw, and no matter how many times the IN signal transitions during the time tw.

It will be appreciated that the length of delay time $t_d$ for the delay circuit 120 (FIG. 2) can be selected to accommodate various operations related to having a DRAM memory core. For example, as previously mentioned, as is well known in the art, DRAM memory cells need to be periodically refreshed to retain data. The delay $t_d$ through the delay chain 120 can be selected such that a memory array refresh operation can be performed during $t_d$. That is, the time for $t_d$ can be matched according to the memory array refresh access time taking into consideration such factors as the impedance and gate delays encountered during the refresh operation. By selecting $t_d$ in this fashion, a memory array refresh operation that is in progress can be completed, and thus, avoid any potential loss of data, although a new address assertion is made during the operation because actual access to the memory array is not initiated until after the delay time $t_d$ has elapsed. By this time, the memory refresh operation would have been completed.

The selection of $t_d$ will determine to some degree the delay time $t_{dd}$ of the delay device 182 (FIG. 3) in each delay stage 140. It will be appreciated that $t_d$ and $t_{dd}$ are related in a manner that $t_d$ is roughly the product of the number of delay stages 140 and $t_{dd}$. Thus, for a given time $t_d$, fewer delay stages can be used where $t_{dd}$ is made longer. Alternatively, more delay stages could be used where $t_{dd}$ is made shorter. Moreover, although the each delay stage 140 has been described herein as having the same delay time $t_{dd}$, the delay time of each delay stage can be modified such that more than one common $t_{dd}$ is used without departing from the scope of the present invention.

With respect to selecting a suitable time delay $t_w$ for the delay device 208 in the pulse circuit 200 (FIG. 4), $t_w$ can be selected so that a pulse generated by the pulse circuit 200 will ensure that each of the delay stages 140 will be reset, even if the input pulse to the pulse circuit 200 is less than $t_w$.

As previously mentioned, it will be appreciated that the polarity of many of the signals can be reversed without departing from the scope of the present invention. Consequently, alternative embodiments of the invention can be implemented through the use of alternative circuitry that accommodate the reversed signal polarity and remain within the invention. For example, the delay stage 140 (FIG. 3) has been illustrated and described as including a two-input NOR gate 180. However, a delay stage could also be implemented using a two-input NAND gate if the polarity of the signals are reversed. Other previously described circuits can be modified in the same manner, as is well known in the art. Thus, as previously discussed, the particular polarity and associated circuitry used in implementing embodiments of the present invention can be modified without departing from the scope of the present invention.

Figure 5:
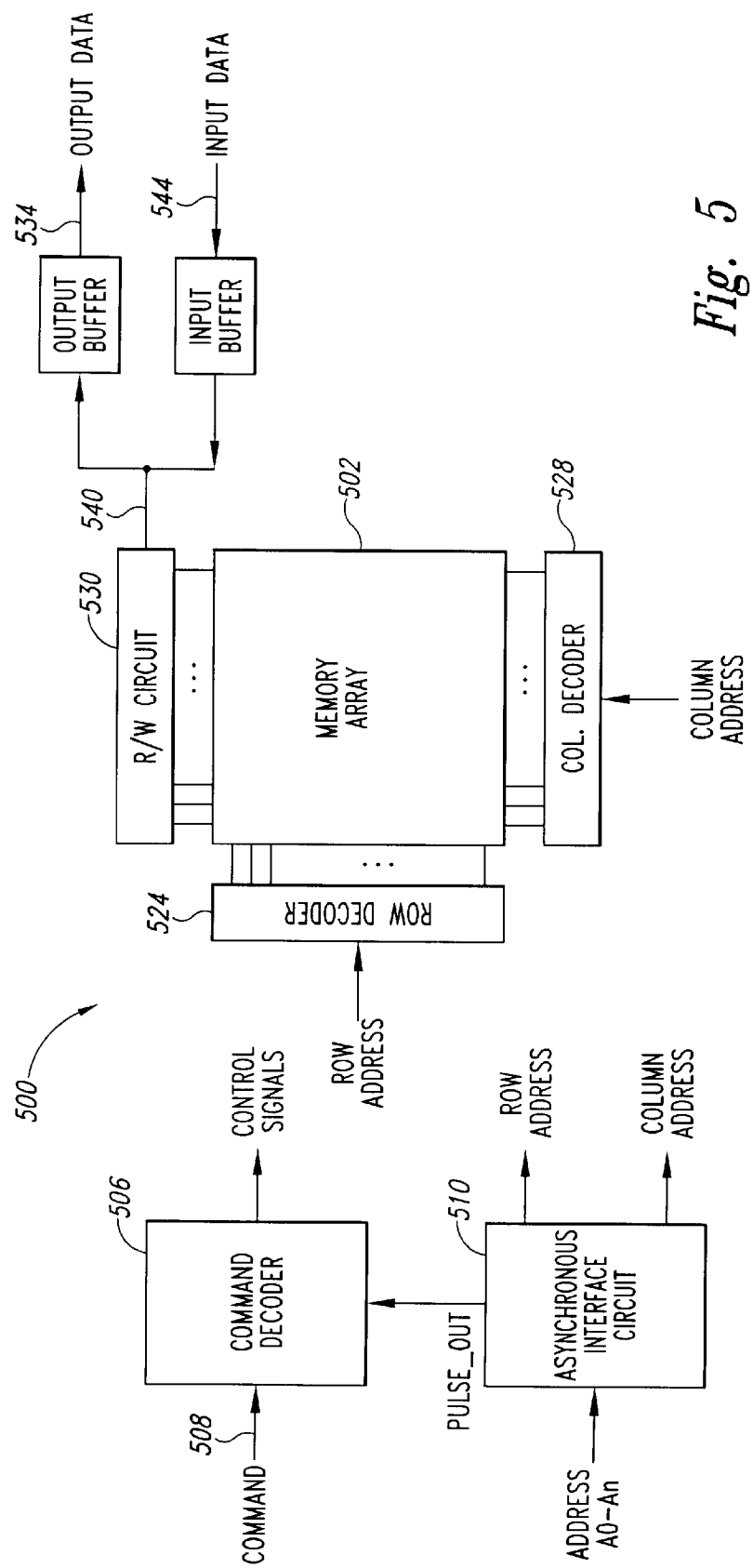
FIG. 5 is a functional block diagram of a portion of a memory device including an asynchronous interface circuit according to an embodiment of the present invention.

FIG. 5 illustrates a portion of a memory device 500 according to an embodiment of the present invention. The memory device 500 is an asynchronous pseudo-static SRAM that includes a conventional DRAM memory array 502. The memory device 500 includes a command decoder 506 that receives memory commands through a command bus 508 and generates corresponding control signals within the memory device 500 to carry out various memory operations. Row and column address signals are applied to the memory device 500 through an address bus 520 and provided to an asynchronous interface circuit 510 that is in accordance with an embodiment of the present invention. As previously described, the asynchronous interface circuit 510 generates a PULSE_OUT pulse to start an access operation to the memory array 502. As illustrated in FIG. 5, the PULSE_OUT pulse is provided to the command decoder 506. However, it will be appreciated that the PULSE_OUT signal can be provided to alternative or additional functional blocks of the memory device 500 without departing from the scope of the present invention.

The row and column addresses are provided by address input buffers (not shown) included in the asynchronous interface circuit 510 for decoding by a row address decoder 524 and a column address decoder 528, respectively. Memory array read/write circuitry 530 are coupled to the array 502 to provide read data to a data output buffer 534 via a input-output data bus 540. Write data are applied to the memory array 502 through a data input buffer 544 and the memory array read/write circuitry 530. The command controller 506 responds to memory commands applied to the command bus 508 to perform various operations on the memory array 502. In particular, the command controller 506 is used to generate internal control signals to read data from and write data to the memory array 502. During one of these access operations, an address provided on the address bus 520 is decoded by the row decoder 524 to access one row of the memory array 502. Likewise, input provided on the address bus 520 is decoded by the column decoder 528 to access at least one column of the memory array 502. During a read operation, the data stored in the addressed memory cell or cells are then transferred to the output buffer 534 and provided on the data output lines. In a write operation, the addressed memory cell is accessed and data provided on the data input lines and the data input buffer 544 is stored in the cell.

Figure 6:
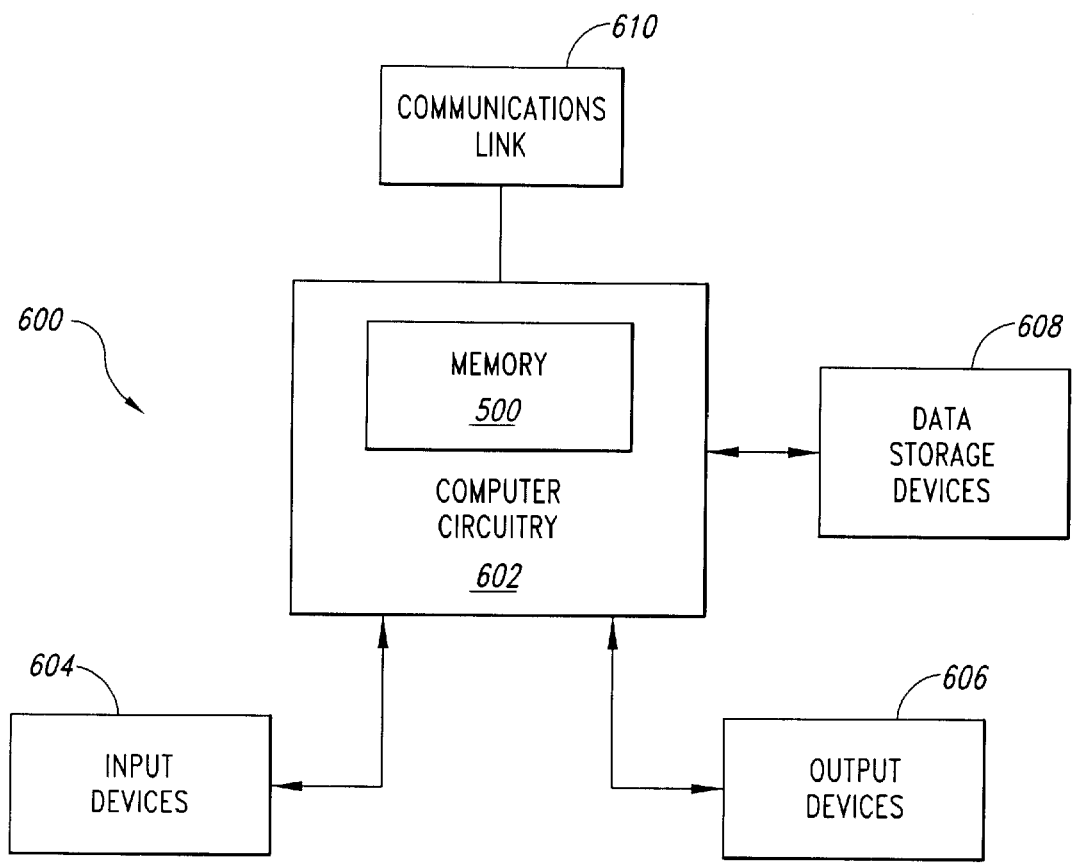
FIG. 6 is a functional block diagram of a computer system including memory devices of FIG. 5.

FIG. 6 is a block diagram of a computer system 600 including computer circuitry 602 that contains the memory device 500 of FIG. 5. The computer circuitry 602 performs various computing functions, such as executing specific software to perform specific calculations or tasks. In addition, the computer system 600 includes one or more input devices 604, such as a keyboard, coupled to the computer circuitry 602 to allow an operator to interface with the computer system. Typically, the computer system 600 also includes one or more output devices 606 coupled to the computer circuitry 602, such output devices typically being a display device. One or more data storage devices 608 are also typically coupled to the computer circuitry 602 to store data or retrieve data. Examples of storage devices 608 include hard disks and non-volatile memory. The computer system 600 also includes a wireless communication link 610 through which the computer circuitry can send and receive data through a wireless medium. The computer circuitry 602 is typically coupled to the memory device 500 through appropriate address, data, and control busses to provide for writing data to and reading data from the memory.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An address interface circuit for a memory device, comprising:
   an address transient detection circuit receiving an address signal and generating a detection pulse having a falling edge in response to each transition in the address signal;
   a delay circuit having an input coupled to the address transient detection circuit to receive the detection pulse and further having an output at which a trigger signal is provided, the delay circuit generating the trigger signal a time delay following the falling edge of the last received detection pulse; and
   a pulse generator having an input coupled to receive the trigger signal generated by the delay circuit and further having an output at which a an initiation pulse is provided in response to the trigger signal to initiate a memory access operation, the time delay of the delay circuit of sufficient length to allow completion of the memory access operation.

2. The address interface circuit of claim 1 wherein the delay circuit comprises a chain of delay stages having a first delay stage coupled to the address transient detection circuit to receive the detection pulse and a last delay stage having an output at which the trigger signal is provided, each delay stage having first and second inputs and an output and delaying a falling edge of a signal applied to either of the first or second inputs from propagating to its output by a stage time delay.

3. The address interface circuit of claim 1, further comprising a pulse circuit coupled between the address transient detection circuit and the delay circuit for generating a pulse signal having a minimum pulse width in response to the detection pulse.

4. The address interface circuit of claim 1 wherein the pulse generator provides the initiation pulse in response to the falling edge of the trigger signal.

5. The address interface circuit of claim 1 wherein the delay circuit comprises a delay chain having a plurality of delay stages coupled in series through which the falling edge of the last received detection pulse propagates to the output to be provided as the trigger signal.

6. An address input circuit for a memory device, comprising:
   an input buffer coupled to receive address signals and generate in response thereto an address detection pulse;
   a chain of delay stages through which the address detection pulse propagates having a last delay stage from which the address detection pulse is output when a time delay elapses without receipt of another address detection pulse, each of the delay stages having a two-input NOR gate having an output, a first of the inputs coupled to the output of the input buffer and a second of the inputs coupled to receive the output of a previous delay stage, a delay circuit coupled to the output of the NOR gate for providing an output signal that is a delayed version of the output of the NOR gate, and an inverter coupled to the delay circuit; and
   a pulse generator generating an output signal initiating a memory access operation in response to receiving the address detection pulse from the last delay stage.

7. The address input circuit of claim 6 wherein the input buffer comprises an address transient detection circuit generating the address detection pulse in response to detecting a transition in an address signal.

8. The address input circuit of claim 7 wherein the input buffer further comprises a pulse circuit for generating a detection pulse having a minimum pulse width.

9. The address input circuit of claim 6 wherein the output signal initiating the memory access operation comprises a falling edge of the address detection pulse.

10. An asynchronous memory address interface circuit, comprising:
    an address detection circuit receiving a memory address and generating an output pulse in response to each receipt of a new memory address; and
    a pulse circuit coupled to the address detection circuit and generating an initiation pulse to initiate a memory access operation having a sequence of access events after a time delay elapses from receiving the output pulse, otherwise, resetting the time delay in response to receiving another detection pulse prior to the time delay elapsing and generating the initiation pulse the time delay thereafter, the time delay of sufficient length to allow completion of the sequence of access events.

11. The asynchronous memory address interface circuit of claim 10 wherein the pulse circuit comprises:
    a chain of delay stages having a first delay stage coupled to the address detection circuit to receive the output pulse and a last delay stage having an output at which a trigger signal is provided, each delay stage having first and second inputs and an output and delaying a falling edge of a signal applied to either of the first or second inputs from propagating to its output by a stage time delay; and
    a pulse generator for generating the initiation pulse in response to the falling edge of the trigger signal.

12. The asynchronous memory address interface circuit of claim 11 wherein each of the delay stages comprises:
    a two-input NOR gate having an output, a first of the inputs coupled to the output of the address detection circuit and a second of the inputs coupled to receive the output of a previous delay stage;
    a delay circuit coupled to the output of the NOR gate for providing an output signal that is a delayed version of the output of the NOR gate; and
    an inverter coupled to the delay circuit.

13. The asynchronous memory address interface circuit of claim 10, further comprising a pulse width circuit coupled between the address detection circuit and the pulse circuit to generate an output pulse for the pulse circuit having a minimum pulse width.

14. The asynchronous memory address interface circuit of claim 10 wherein the pulse circuit comprises:
    a delay circuit having an input coupled to the address detection circuit to receive the output pulse and further having an output at which a trigger signal is provided, the delay circuit generating the trigger signal a time delay following the falling edge of the last received detection pulse; and a pulse generator having an input coupled to receive the trigger signal generated by the delay circuit and further having an output at which the initiation pulse is provided in response to the trigger signal.

15. A memory device, comprising:
an array of volatile memory cells having access thereto limited by completion of an access cycle including a sequence of access events;
an input buffer coupled to receive address signals and generate in response thereto an address detection pulse;
a delay circuit coupled to the input buffer and initiating a delay sequence based on the falling edge of the transition detection pulse, the delay sequence of sufficient length of time to allow completion of the sequence of access events, the delay circuit resetting the delay sequence in response to the falling edge of a new transition detection pulse generated prior to completion of the delay sequence and restarting the delay sequence from the falling edge of the new transition detection pulse; and
a pulse generator coupled to the delay circuit, the pulse generator generating a pulse to start the sequence of access events in response to the completion of the delay sequence.

16. The memory device of claim 15 wherein the delay circuit comprises a chain of delay stages having a first delay stage coupled to the input buffer to receive the address detection pulse and a last delay stage having an output at which a trigger signal is provided to the pulse generator, each delay stage having first and second inputs and an output and delaying a falling edge of a signal applied to either of the first or second inputs from propagating to its output by a stage time delay.

17. The memory device of claim 16 wherein the pulse generator provides the initiation pulse in response to the falling edge of the trigger signal.

18. The memory device of claim 15, further comprising a pulse circuit coupled between the input buffer and the delay circuit for generating a pulse signal having a minimum pulse width in response to the address detection pulse.

19. The memory device of claim 15 wherein the delay circuit comprises a delay chain having a plurality of delay stages coupled in series through which the falling edge of the last received address detection pulse propagates to the output to be provided as a trigger signal to the pulse generator.

20. The memory device of claim 15 wherein the input buffer comprises an address transient detection circuit generating the address detection pulse in response to detecting a transition in an address signal.

21. A memory device, comprising:
an array of volatile memory cells having access thereto limited by completion of an access cycle including a sequence of access events;
memory array access circuitry coupled to the array of volatile memory cells for accessing the memory array in accordance with the sequence of events;
an address detection circuit receiving a memory address and generating an output pulse in response to each receipt of a new memory address; and
a pulse circuit coupled to the address detection circuit and generating an initiation pulse provided to the memory array access circuitry to initiate the sequence of access events after a time delay elapses from receiving the output pulse, otherwise, resetting the time delay in response to receiving another output pulse prior to the time delay elapsing and generating the initiation pulse the time delay thereafter, the time delay of sufficient length to allow completion of the sequence of access events once initiated.

22. The memory device of claim 21 wherein the pulse circuit comprises:
a chain of delay stages having a first delay stage coupled to the address detection circuit to receive the output pulse and a last delay stage having an output at which a trigger signal is provided, each delay stage having first and second inputs and an output and delaying a falling edge of a signal applied to either of the first or second inputs from propagating to its output by a stage time delay; and
a pulse generator for generating the initiation pulse in response to the falling edge of the trigger signal.

23. The memory device of claim 21, further comprising a pulse width circuit coupled between the address detection circuit and the pulse circuit to generate an output pulse for the pulse circuit having a minimum pulse width.

24. The memory device of claim 21 wherein the pulse circuit comprises:
a delay circuit having an input coupled to the address detection circuit to receive the output pulse and further having an output at which a trigger signal is provided, the delay circuit generating the trigger signal a time delay following the falling edge of the last received detection pulse; and
a pulse generator having an input coupled to receive the trigger signal generated by the delay circuit and further having an output at which the initiation pulse is provided in response to the trigger signal.

25. A computer system, comprising:
a data input device;
a data output device;
a processor coupled to the data input and output devices; and
a memory device coupled to the processor, the memory device comprising:
an array of volatile memory cells having access thereto limited by completion of an access cycle including a sequence of access events;
an input buffer coupled to receive address signals and generate in response thereto an address detection pulse;
a delay circuit coupled to the input buffer and initiating a delay sequence based on the falling edge of the transition detection pulse, the delay sequence of sufficient length of time to allow completion of the sequence of access events once initiated, the delay circuit resetting the delay sequence in response to the falling edge of a new transition detection pulse generated prior to completion of the delay sequence and restarting the delay sequence from the falling edge of the new transition detection pulse; and
a pulse generator coupled to the delay circuit, the pulse generator generating a pulse to start the sequence of access events in response to the completion of the delay sequence.

26. The computer system of claim 25 wherein the delay circuit of the memory device comprises a chain of delay stages having a first delay stage coupled to the input buffer to receive the address detection pulse and a last delay stage having an output at which a trigger signal is provided to the pulse generator, each delay stage having first and second inputs and an output and delaying a falling edge of a signal applied to either of the first or second inputs from propagating to its output by a stage time delay.

27. The computer system of claim 26 wherein the pulse generator of the memory device provides the initiation pulse in response to the falling edge of the trigger signal.

28. The computer system of claim 25 wherein the memory device further comprises a pulse circuit coupled between the input buffer and the delay circuit for generating a pulse signal having a minimum pulse width in response to the address detection pulse.

29. The computer system of claim 25 wherein the delay circuit of the memory device comprises a delay chain having a plurality of delay stages coupled in series through which the falling edge of the last received address detection pulse propagates to the output to be provided as a trigger signal to the pulse generator.

30. The computer system of claim 25 wherein the input buffer of the memory device comprises an address transient detection circuit generating the address detection pulse in response to detecting a transition in an address signal.

31. A method for accessing a memory array of volatile memory cells where access to the memory array is limited by completion of an access cycle having a sequence of events, the method comprising:

receiving memory address signals having unrestricted randomly scheduled address transitions;

converting the unrestricted randomly scheduled address transitions of the memory address signals into scheduled address events by generating an initiation pulse to initiate the sequence of events a fixed time after the last address transition, the fixed time of sufficient length to allow completion of the sequence of events once initiated; and initiating the sequence of events to access the memory array of volatile memory cells in response to the scheduled address events.

32. The method of claim 31 wherein converting the unrestricted randomly scheduled address transitions comprises:

initiating a delay sequence in response to an address transition;

resetting the delay sequence in response to a new address transition detected prior to completion of the delay sequence and restarting the delay sequence in response to the new address transition; and starting the sequence of access events in response to the completion of the delay sequence.

33. The method of claim 32, further comprising:

generating a transition detection pulse in response to detecting a transition in a memory address signal; and propagating a falling edge of the last transition detection pulse generated through a delay chain having a time delay; and generating an initiation pulse to start the sequence of access events upon the time delay elapsing.

34. The method of claim 33 wherein generating the initiation pulse is in response to the falling edge of the last transition detection pulse propagating through the delay chain without detection of another address transition.

35. The method of claim 33 wherein generating the transition detection pulse comprises generating a transition detection pulse having a minimum pulse width.

36. The method of claim 31 wherein the sequence of events comprises:

activating a row of memory cells in the memory array;

refreshing data of the memory cells of the activated row; and deactivating the row of memory cells to maintain the respective data therein.

37. The method of claim 31 wherein converting the unrestricted randomly scheduled address transitions comprises:

restarting a time delay each time an address transition occurs prior to the time delay elapsing; and generating an initiation pulse in response to the time delay elapsing.

38. A method for converting unrestricted randomly scheduled address transitions of memory address signals into scheduled address events from which a sequence of access events are initiated for accessing a memory array of volatile memory cells, the method comprising:

generating a transition detection pulse in response to detecting a transition in a memory address signal;

initiating a delay sequence based on the falling edge of the transition detection pulse;

resetting the delay sequence in response to the falling edge of a new transition detection pulse generated prior to completion of the delay sequence and restarting the delay sequence from the falling edge of the new transition detection pulse; and starting the sequence of access events in response to the completion of the delay sequence, the delay sequence of sufficient length of time to allow completion of the sequence of access events once started.

39. The method of claim 38 wherein generating the transition detection pulse comprises generating a transition detection pulse having a minimum pulse width.

40. The method of claim 38 wherein the sequence of events comprises:

activating a row of memory cells in the memory array;

refreshing data of the memory cells of the activated row; and deactivating the row of memory cells to maintain the respective data therein.

41. The method of claim 38 further comprising generating an initiation pulse to start the sequence of access events in response to completion of the delay sequence.

42. The method of claim 38 wherein initiating a delay sequence comprises propagating a falling edge of the transition detection pulse through a delay chain having a time delay.

* * * * *

UNITED STATES PATENT AND TRADEMARK OFFICE
CERTIFICATE OF CORRECTION

PATENT NO. : 6,690,606 B2
DATED : February 10, 2004
INVENTOR(S) : Simon J. Lovett et al.

It is certified that error appears in the above-identified patent and that said Letters Patent is hereby corrected as shown below:

Title page,
Item [56], References Cited, OTHER PUBLICATIONS, "1.8 Volt ® Wireless Flash Memory ( W18)," should read -- 1.8 Volt Intel® Wireless Flash Memory ( W18), --

Column 7,
Line 29, "which a an initiation" should read -- which an initiation --

Signed and Sealed this

Thirty-first Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,690,606 B2
DATED : February 10, 2004
INVENTOR(S) : Simon J. Lovett et al.

It is certified that error appears in the above-identified patent and that said Letters Patent is hereby corrected as shown below:

Column 1,
Line 17, reads "to the use as not" should read -- to the user as not --

Column 4,
Line 60, reads "less than tw." should read -- less than $t_w$. --

Column 5,
Line 17, reads "delay ot tw." should read -- delay of $t_w$. --
Line 22, reads "less than tw," should read -- less than $t_w$, --
Line 23, reads "during the time tw." should read -- during the time $t_w$. --
Line 50, reads "although the each" should read -- although each --

Column 6,
Line 35, reads "a input-output" should read -- an input-output --

Signed and Sealed this

Sixteenth Day of November, 2004

JON W. DUDAS
*Director of the United States Patent and Trademark Office*